United States Patent
Hattanda et al.

(10) Patent No.: US 7,215,223 B2
(45) Date of Patent: May 8, 2007

(54) SURFACE ACOUSTIC WAVE DEVICE

(75) Inventors: Tomoka Hattanda, Yokohama (JP);
Osamu Kawachi, Yokohama (JP)

(73) Assignee: Fujitsu Media Devices Limited,
Yokohama (JP)

( * ) Notice: Subject to any disclaimer, the term of this patent is extended or adjusted under 35 U.S.C. 154(b) by 52 days.

(21) Appl. No.: 11/033,274

(22) Filed: Jan. 12, 2005

(65) Prior Publication Data

US 2005/0151602 A1   Jul. 14, 2005

(30) Foreign Application Priority Data

Jan. 13, 2004   (JP)   ............... 2004-005954

(51) Int. Cl.
*H03H 9/00*   (2006.01)
*H03H 9/25*   (2006.01)
(52) U.S. Cl. ...................... 333/193; 333/133
(58) Field of Classification Search ............... 333/133, 333/193; 310/313 R, 313 B; 257/778
See application file for complete search history.

(56) References Cited

U.S. PATENT DOCUMENTS

| | | | |
|---|---|---|---|
| 6,388,545 B1 * | 5/2002 | Kawachi et al. | 333/193 |
| 6,417,574 B1 * | 7/2002 | Misawa et al. | 257/778 |
| 6,437,439 B1 * | 8/2002 | Shimoe | 257/734 |
| 6,754,950 B2 | 6/2004 | Furukawa et al. | |
| 6,919,777 B2 * | 7/2005 | Taniguchi et al. | 333/133 |
| 6,930,570 B2 * | 8/2005 | Nakamura et al. | 333/193 |

FOREIGN PATENT DOCUMENTS

| | | |
|---|---|---|
| EP | 0 961 404 A2 | 12/1999 |
| EP | 0 991 185 A2 | 4/2000 |
| EP | 1 076 414 A2 | 2/2001 |
| JP | 2000-332564 | 11/2000 |

\* cited by examiner

*Primary Examiner*—Dean Takaoka
(74) *Attorney, Agent, or Firm*—Arent Fox, LLP.

(57) ABSTRACT

A surface acoustic wave (SAW) device includes a SAW chip including comb-like electrodes arranged on a piezoelectric substrate, and a package on which the SAW chip is flip-chip mounted, the package including an interconnection that connects the comb-like electrodes. Resonators are connected to signal interconnection pads through the interconnection pattern. IDTs in a three-IDT multimode filter are respectively connected to the signal interconnection pads via another interconnection pattern. The signal interconnection pads are connected to a signal interconnection provided on a chip mounting surface with bumps. Then, a part of the interconnection pattern connecting the resonators is extracted onto the package. It is thus possible to design the interconnections on the package flexibly and thereby easy to adjust the impedance of the interconnections that connect the resonators.

2 Claims, 14 Drawing Sheets

SAW DEVICE 1A

FIG. 1 SAW CHIP 900a

-- PRIOR ART --

FIG. 2 SAW CHIP 900b

-- PRIOR ART --

FIG. 3　　　　　　　PACKAGE 900c

-- PRIOR ART --

FIG. 4 SAW CHIP 1b

FIG. 5  PACKAGE 1c

FIG. 6

SAW DEVICE 1A

FIG. 10  SAW DEVICE 900A

FIG. 11    PACKAGE 1c'

FIG. 12 SAW DEVICE 1A'

FIG. 13

FIG. 14    SAW CHIP 1a

FIG. 15    PACKAGE 1d

FIG. 16      SAW DEVICE 1B

SURFACE ACOUSTIC WAVE DEVICE

BACKGROUND OF THE INVENTION

1. Field of the Invention

This invention generally relates to a surface acoustic wave device, and more particularly, to a surface acoustic wave device, which is employed in an RF unit on a mobile telephone and features an excellent low loss and an excellent shape factor.

2. Description of the Related Art

In recent years, surface acoustic wave (hereinafter simply referred to as SAW) filters have come into wide use as filters on mobile telephones. Reasons of this wide use are that the SAW filters are small-sized, lightweight, and excellent in the shape factor, as compared to other filters such as a dielectric filter, a multilayered LC filter, or the like.

Generally, a SAW device is configured to use a SAW chip having comb-like interdigital transducers (hereinafter referred to as IDTs) on a piezoelectric material substrate (hereinafter referred to as piezoelectric substrate). The SAW chip is hermetically sealed within a cavity. In this configuration, electric signals are applied to an IDT on the input side, the signals are converted into the SAW, and the SAW travels on the piezoelectric substrate. It is thus possible to obtain the electric signals, on which a given modulation has been performed, from the other IDT on the output side.

Figure 1:
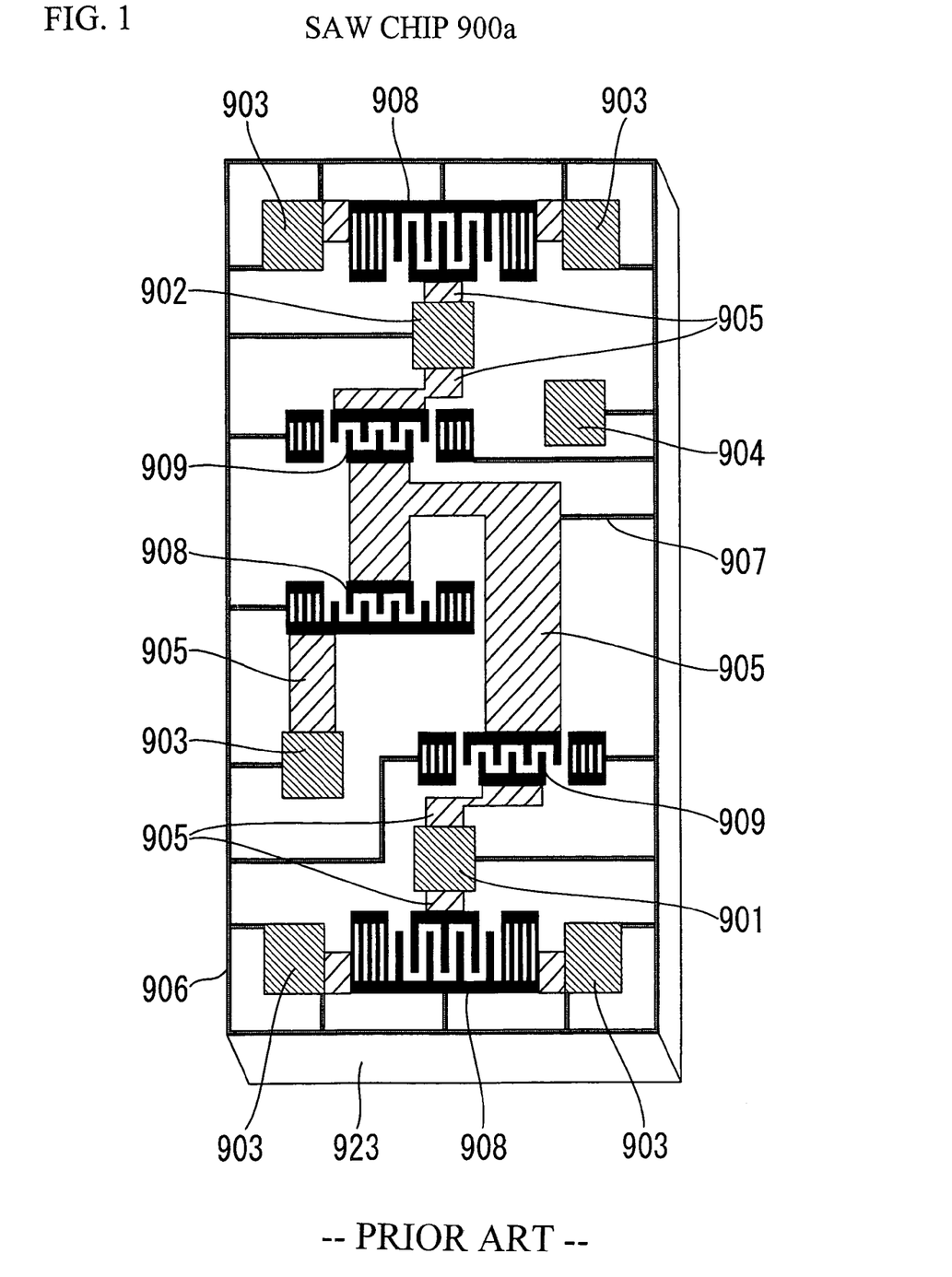

FIG. 1 shows a configuration of a conventional SAW chip 900a. The SAW chip 900a is configured as a four-stage ladder-type filter.

Referring to FIG. 1, the SAW chip 900a includes an input signal pad 901, an output signal pad 902, ground pads 903, a dummy pad 904, interconnection patterns 905, a dicing line 906, short bars 907, parallel resonators 908, and series resonators 909. These are arranged on a main surface (which is an upper surface) of a piezoelectric substrate 923. More precisely, a parallel resonator 908 and a series resonator 909 are connected to the input signal pad 901 via an interconnection pattern 905. Another parallel resonator 908 and another series resonator 909 are connected to the output signal pad 902 via another interconnection pattern 905. Still another parallel resonator 908 is connected in parallel with the above-mentioned two series resonators 909 via still another interconnection pattern 905. The input signal pad 901 is used for feeding high-frequency signals to the SAW chip 900a. The output signal pad 902 is used for extracting the high-frequency signals that have passed the SAW chip 900a. Each of the parallel resonator 908 and the series resonator 909 is configured to include an IDT and reflection electrodes.

The parallel resonators 908 are respectively connected to ground pads 903 via interconnection patterns 905. The ground pads 903 serve as terminals that are connected to a ground line on a package. That is, the parallel resonator 908 is connected the series resonator 909 and the ground. A reference numeral 904 in FIG. 1 denotes a dummy pad.

The parallel resonator 908, the series resonator 909, the input signal pad 901, the output signal pad 902, the ground pads 903, and the dummy pad 904 are connected to a metal pattern provided for the purpose of avoiding pyroelectricity via the short bar 907. The metal pattern is arranged on an outer circumference of the upper side of the piezoelectric substrate 923, namely, the dicing line 906. The short bar 907 is also a metal pattern.

Figure 2:
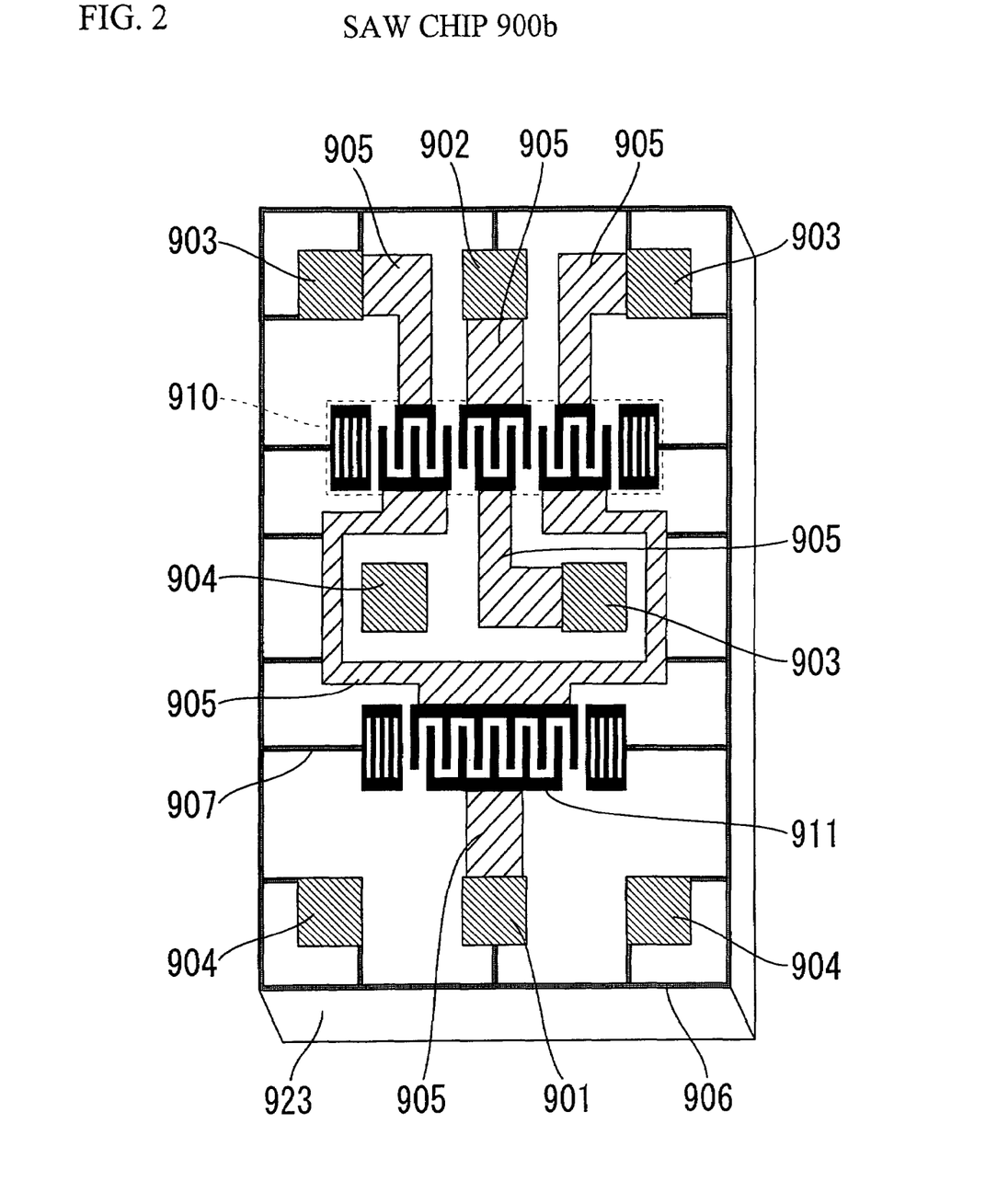
FIG. 2 shows a configuration of a conventional SAW chip 900b.

FIG. 2 shows a configuration of a conventional SAW chip 900b, which is configured as a DMS (Double Mode SAW) filter. Hereinafter, in FIG. 2, the same components and configurations as those of FIG. 1 have the same reference numerals.

Referring to FIG. 2, the SAW chip 900b includes a resonator 911 that is connected to the input signal pad 901 via the interconnection pattern 905, a three-IDT multimode filter 910 that is connected to the output signal pad 902 and three ground pads 903 via another interconnection pattern 905. These are arranged on the upper side of the piezoelectric substrate 923. The resonator 911 and the three-IDT multimode filter 910 are configured to include the IDTs and the reflection electrodes. The three-IDT multimode filter is configured to include three IDTs.

The resonator 911, the three-IDT multimode filter 910, the input signal pad 901, the output signal pad 902, the ground pads 903, and the dummy pads 904 are connected to the metal pattern that is provided on the dicing line 906 for the purpose of avoiding pyroelectricity, via the short bar 907.

Figure 3:
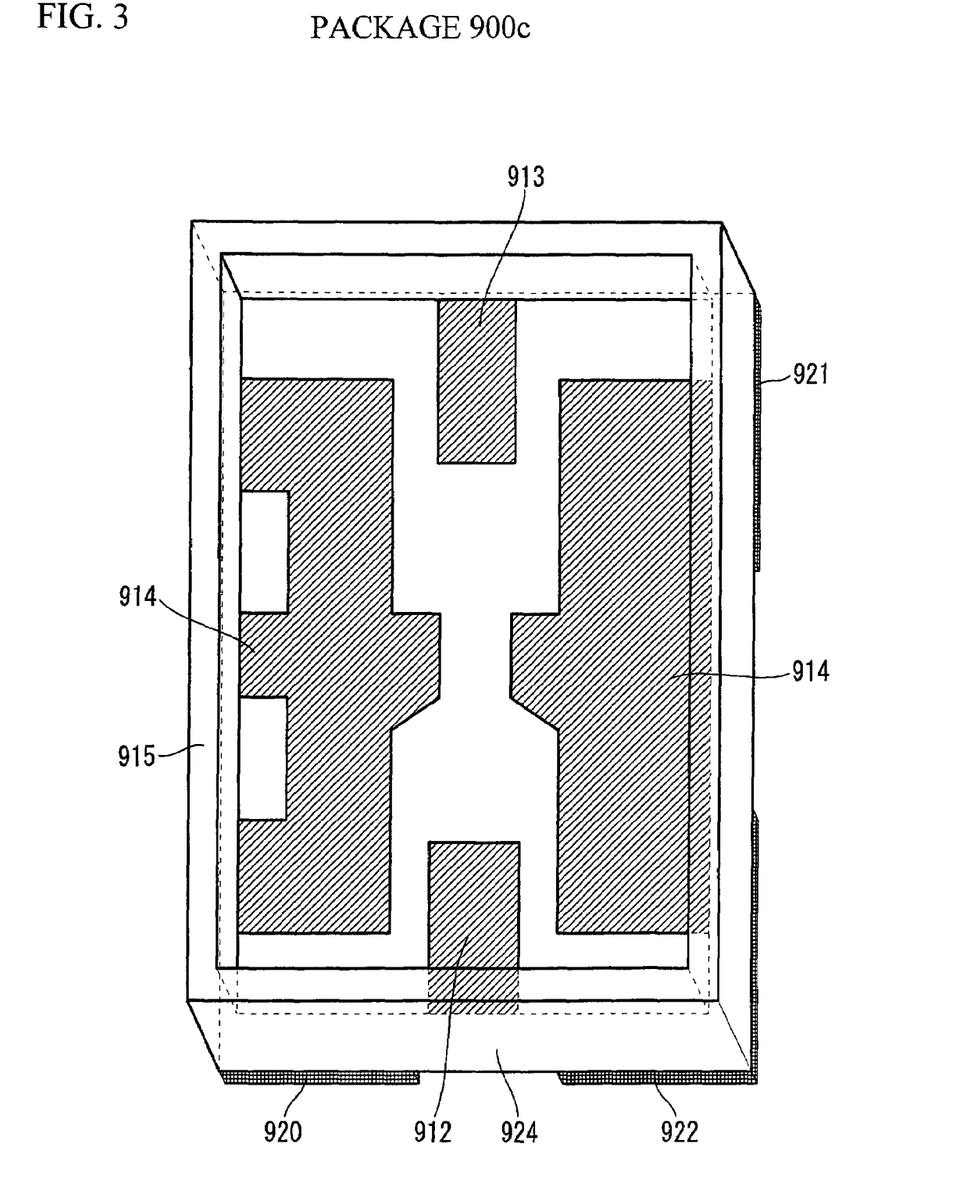
FIG. 3 is a perspective view of a conventional package 900c.

The above-mentioned SAW chips 900a and 900b are respectively mounted on packages 900c as shown in FIG. 3 in a facedown state by a flip chip mounting. Mounting in the facedown state denotes that the upper side of the SAW chip, on which the IDTs and various pads are provided, is mounted with facing a mounting surface of the package 900c.

As shown in FIG. 3, the package 900c includes the cavity so as to mount the SAW chip 900b on a substrate 924. An opening of the cavity is provided on a main surface, or the upper surface of the substrate 924. The bottom of the cavity is a chip mounting surface. On this mounting surface, an input signal interconnection 912, an output signal interconnection 913, and a ground interconnection 914 are arranged on positions that correspond to various pads of the SAW chip 900b. The above-mentioned interconnections are connected to the various pads with bumps when the SAW chip 900b is mounted, referring to bumps in FIG. 10. Thus, the package 900c and the SAW chip 900b are electrically coupled and are secured mechanically.

A backside input terminal 920, a backside output terminal 921, and a backside ground terminal 922, which serve as external terminals, are arranged on the backside of the package 900c. The backside input terminal 920 is electrically coupled to the input signal interconnection 912 on the mounting surface through the interconnection pattern including a via interconnection that penetrates a lower part of the substrate 924. The backside input terminal 921 is electrically coupled to the output signal interconnection 913 on the mounting surface through the interconnection pattern including another via interconnection that penetrates the lower part of the substrate 924. The backside ground terminal 922 is electrically coupled to the ground interconnection 914 on the mounting surface through the interconnection pattern including still another via interconnection that penetrates the lower part of the substrate 924. That is, the input signal interconnection 912, the output signal interconnection 913, and the ground interconnection 914 are electrically extracted onto the backside of the package 900c.

A seal ring 915 is arranged on the circumference of the opening of the cavity on the substrate. The seal ring 915 is a member to firmly secure another substrate having a shape of plate that serves as a lid. That is, after the SAW chip 900b is mounted, the cavity is sealed with the lid substrate.

In the above-mentioned configuration, the interconnection patterns that connect the resonators were conventionally arranged on the SAW chip as shown in FIG. 1 or 2, for example, as described in Japanese Patent Application Publication No. 2000-332564 (hereinafter referred to as Document 1). Accordingly, any interconnection patterns that connect the resonators are not arranged on the package. In addition, in the conventional technique, it is common that the interconnection patterns are produced in the same process as other conductive patterns such as the resonators or the various pads.

In the case where the resonators and other conductive patterns such as the resonators or the various pads are produced in the same process, however, with respect to the film thickness, the interconnection patterns are as thin as the resonators. This caused a drawback in that a wiring resistance became great. This drawback brings a serious problem to a device used in a system with relatively high-frequency signals such as PCS (Personal Communications Services) particularly. This is because the filter for a high-frequency range has a thin resonator.

A filter for the 800 MHz band and a filter for the 1.9 GHz band may be produced with the identical materials and configurations. In the case where the filter for 800 MHz includes the resonator having a thickness of 330 nanometers, the filter for 1.9 GHz includes the resonator having a thickness of 140 nanometers. That is, the filter for the 1.9 GHz band is 0.4 times as thick as the filter for the 800 MHz band. As a result, a sheet resistance of the 1.9 GHz filter is 290 m$\Omega$ (milliohm), which is 2.6 times as much as that of the 800 MHz filter, which has the sheet resistance of 110 m$\Omega$. Here, aluminum base alloy is employed for an electrode material.

As described above, as the wiring resistance becomes greater, the insertion loss becomes greater. Accordingly, there is a problem in that the filter characteristics are degraded. Additionally, this causes another problem in that as the insertion loss becomes greater, the power consumption is increased.

In the case where the interconnection patterns are produced in the same process as the resonator, the thickness of the interconnection pattern is determined by not only the characteristics required for the interconnection patterns but also other elements. Thus, there is still another problem in that it is difficult to adjust the impedance of the interconnection pattern at an arbitrary value.

In order to solve the above-mentioned problems, a width of the interconnection pattern may be greater, however, this makes a chip area greater. As a result, the SAW device will be greater, too.

SUMMARY OF THE INVENTION

It is a general object of the present invention to provide a small-sized SAW device. Especially, the filter characteristics of the SAW device are improved, and it is easy to adjust an impedance of the interconnection pattern.

According to an aspect of the present invention, preferably, there is provided a surface acoustic wave (SAW) device includes a SAW chip including multiple comb-like electrodes arranged on a piezoelectric substrate, and a package on which the SAW chip is flip-chip mounted, the package including an interconnection that connects the comb-like electrodes. It is thus possible to reduce the insertion loss and improve the filter characteristics. In addition, it is also possible to design the interconnection provided on the package arbitrarily and thereby adjust the impedance of the interconnection that connects the comb-like electrodes to a desired value. Further, it is no longer necessary to widen the width of the interconnection so as to reduce the resistance of the interconnection and adjust the impedance. Thus the SAW device as small as the conventional one is obtainable.

On the above-mentioned SAW device, preferably, the interconnection is provided on a surface of the package that faces the SAW chip.

On the above-mentioned SAW device, the package may comprise a laminated body, and the interconnection of the package is provided in the laminated body. On the above-mentioned SAW device, the SAW device may further include multiple interconnections that connect the comb-like electrodes, wherein a part of the multiple interconnections is provided in the package.

BRIEF DESCRIPTION OF THE DRAWINGS

Preferred embodiments of the present invention will be described in detail with reference to the following drawings, wherein:

FIG. 1 shows a configuration of a conventional SAW chip 900a;

DESCRIPTION OF THE PREFERRED EMBODIMENTS

A description will now be given, with reference to the accompanying drawings, of embodiments of the present invention.

(First Embodiment)

A description will be given of a first embodiment of the present invention. A SAW device 1A, which is the DMS filter, will be described.

The SAW device 1A includes a SAW chip 1b that is arranged inside the cavity of a package 1c in the facedown state by the flip chip mounting. A description will first be given of the SAW chip 1b with the drawings.

Figure 4:
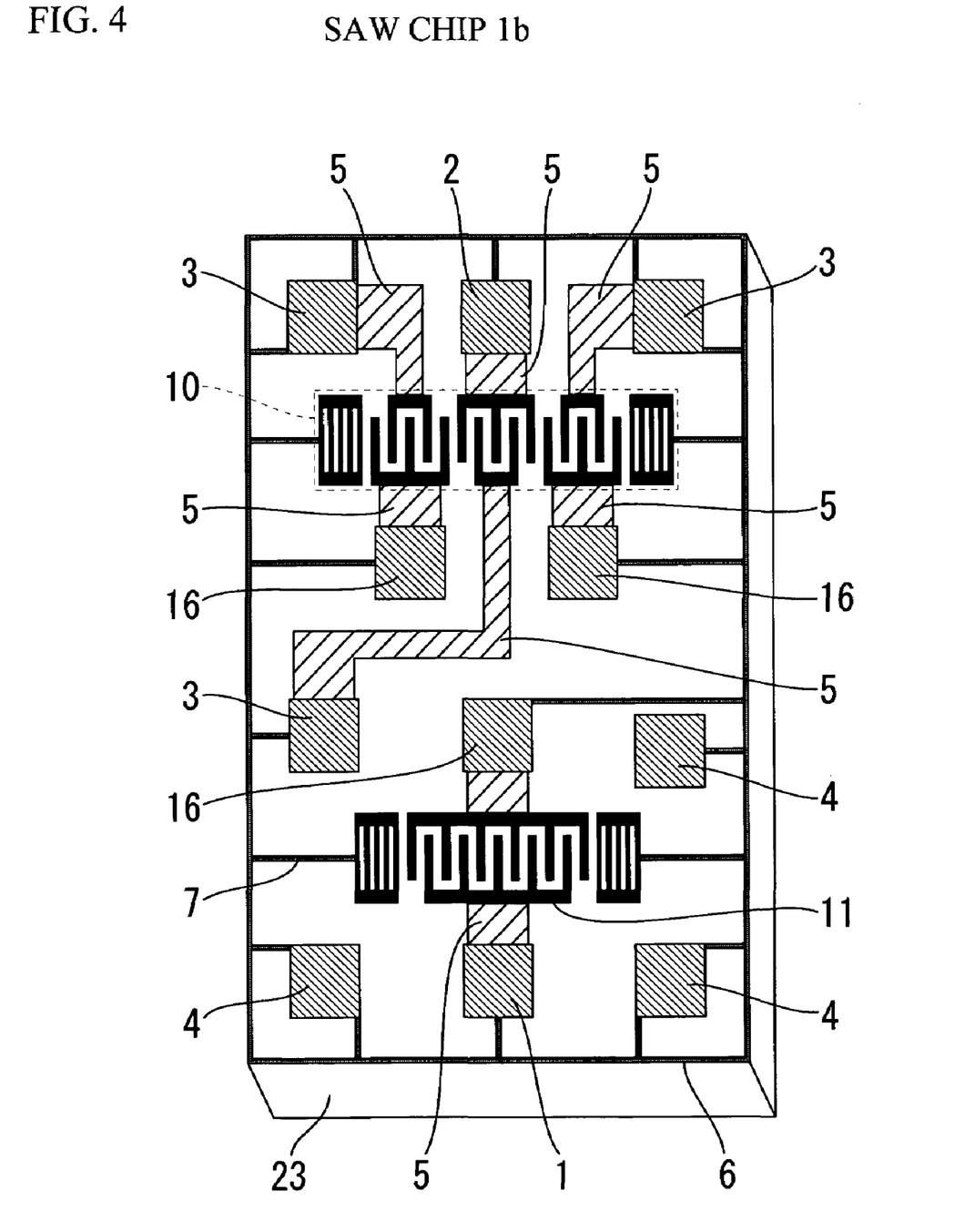
FIG. 4 is a perspective view of a SAW chip 1b in accordance with a first embodiment of the present invention.

FIG. 4 is a perspective view of the SAW chip 1b. Referring to FIG. 4, the SAW chip 1b includes an input signal pad 1, an output signal pad 2, ground pads 3, dummy pads 4, interconnection patterns 5, short bars 7, a three-IDT multimode filter 10, a resonator 11, and signal interconnection pads 16, on a main (upper) surface of a piezoelectric substrate 23.

The piezoelectric substrate 23 may be produced with a piezoelectric material substrate such as lithium tantalate (LT), lithium niobate (LN), or quartz.

Metal patterns such as the input signal pad 1, the output signal pad 2, the ground pads 3, the dummy pads 4, the interconnection patterns 5, the short bars 7, the three-IDT multimode filter 10, and the resonator 11 are produced in the same production process. The short bars 7 include a metal pattern arranged on a dicing line 6. The metal patterns are produced with, for instance, aluminum base alloy, aluminum (Al), copper (Cu), Gold (Au), molybdenum (Mo), tungsten (W), tantalum (Ta), chromium (Cr), titanium (Ti), platinum (Pt), ruthenium (Ru), or rhodium (Rh). The above-mentioned metal patterns may be formed with a single structure or laminated structure.

The resonator 11, which is arranged on an input circuit, includes a single IDT and two reflection electrodes. The IDT is arranged between the two reflection electrodes in the propagation direction of SAW. The resonator 11 is electrically coupled to the input signal pad 1 and the signal interconnection pad 16 respectively via the interconnection pattern 5.

The three-IDT multimode filter 10, which is arranged on an output circuit, includes three IDTs and two reflection electrodes. The three IDTs are arranged between the two reflection electrodes in the SAW propagation direction. A central IDT of the three-IDT multimode filter 10 is electrically and respectively coupled to the ground pad 3 and the output signal pad 2 via another interconnection pattern 5. The other Two IDTs are electrically and respectively coupled to another signal interconnection pad 16 and another ground pad 3.

A metal pattern is arranged on the circumference of the upper surface of the piezoelectric substrate 23, which is denoted by the dicing line 6. The input signal pad 1, the output signal pad 2, the ground pads 3, the dummy pads 4, the three-IDT multimode filter 10, and the resonator 11 are electrically and respectively coupled to the metal pattern arranged on the dicing line 6 via the short bar 7. This prevents pyroelectricity resulting from the metal patterns.

As described above, the resonators 10 and 11 are not directly connected via the interconnection pattern 5 on the SAW chip 1b in accordance with the first embodiment of the present invention. The resonators 10 and 11 are electrically and respectively coupled to the separately arranged signal interconnection pads 16 via the interconnection patterns 5. The signal interconnection pads 16 are electrically connected on the package 1c, as will be described in detail.

Next, a description will be given of the package 1c on which the above-mentioned SAW chip 1b is mounted, with reference to the accompanying drawings.

Figure 5:
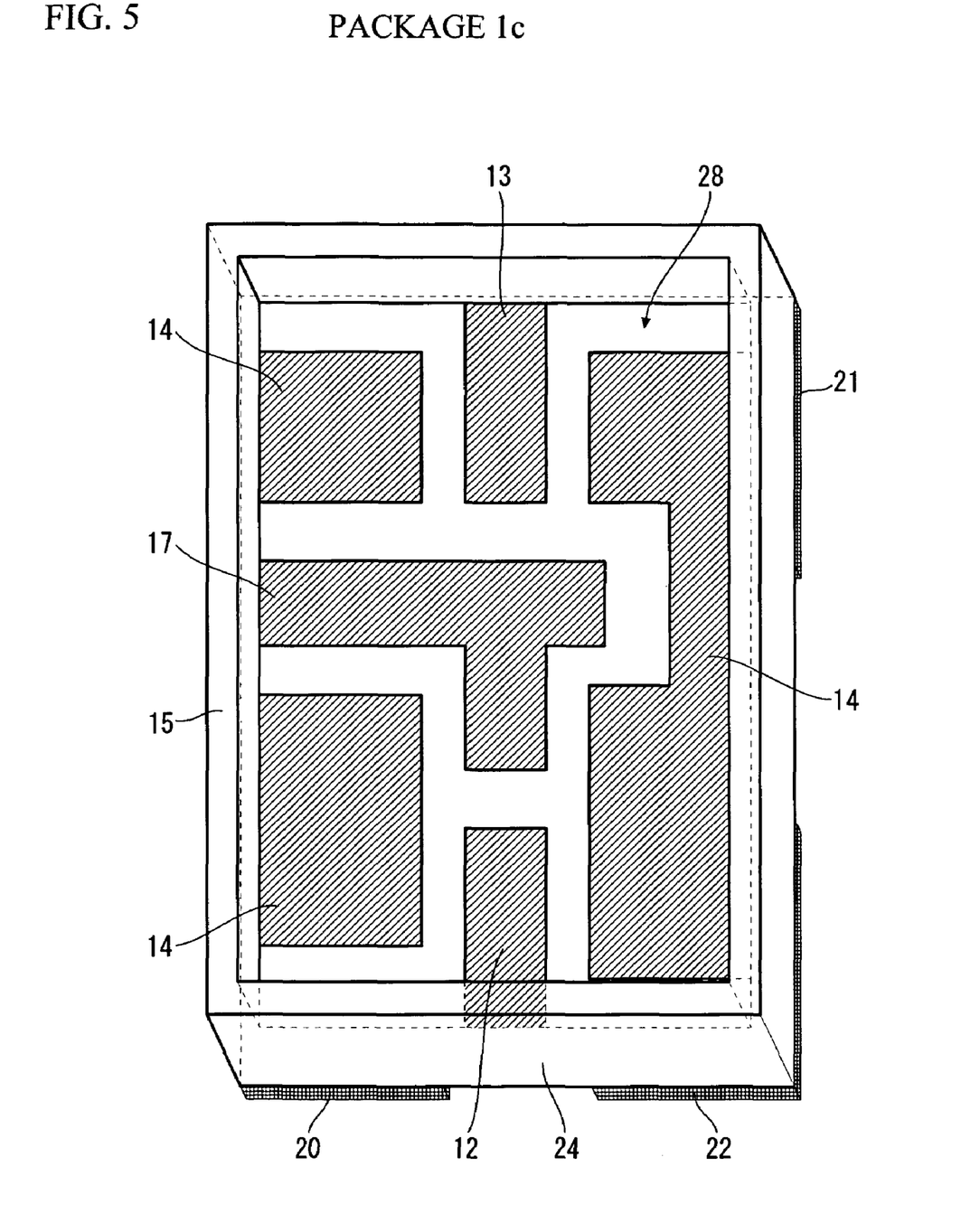
FIG. 5 is a perspective view of a package 1c in accordance with the first embodiment of the present invention.

FIG. 5 is a perspective view of the package 1c. Referring to FIG. 5, the package 1c includes a cavity 28 on a substrate 24. The opening of the cavity 28 is arranged on the main (upper) surface of the substrate 24.

The substrate 24 may be produced with ceramics, aluminum ceramics, bismuth imide triazine resin, polyphenylene ether, polyimide resin, glass epoxy, glass cloth, or silicon. Multiple substrate materials may be laminated or a single substrate material may be employed. The first embodiment of the present invention employs an exemplary laminate body having two substrates laminated. The laminated body includes an upper substrate 24a and a lower substrate 24b. A lower part of the package defines an area ranging from the bottom of the cavity to the backside of the package.

An input signal interconnection 12, an output signal interconnection 13, ground interconnections 14, and a signal interconnection 17 are arranged on positions that correspond to various pads including 1, 2, 3, 4 and 16 of the SAW chip 1b on the bottom of the cavity 28, a chip mounting surface, which is also referred to as a die attach surface.

A backside input terminal 20, a backside output terminal 21, and a backside ground terminal 22 are arranged on the backside of the package 1c. The backside input terminal 20, the backside output terminal 21, and the backside ground terminal 22 serve as external terminals. The backside input terminal 20 is electrically coupled to the input signal interconnection 12 on the chip mounting surface through the interconnection pattern such as a via interconnection that penetrates the lower part of the substrate 24. The backside output terminal 21 is also electrically coupled to the output signal interconnection 13 on the chip mounting surface through another interconnection pattern such as the via interconnection that penetrates the lower part of the substrate 24. The backside ground terminal 22 is electrically coupled to the ground interconnection 14 on the chip mounting surface through still another interconnection pattern such as the via interconnection that penetrates the lower part of the substrate 24. That is, the interconnections 12, 13, and 14 are connected to the chip mounting surface and are also electrically connected to the backside of the package 1c.

A seal ring 15 is arranged on a circumference of the opening of the cavity on the upper surface of the substrate 24. The seal ring 15 is a member to firmly secure another substrate having a shape of plate that serves as a lid (, which is denoted by a reference numeral 26 in FIG. 7). That is, after the SAW chip 1b is mounted, the cavity 28 is hermetically sealed with the lid 26.

Figure 6:
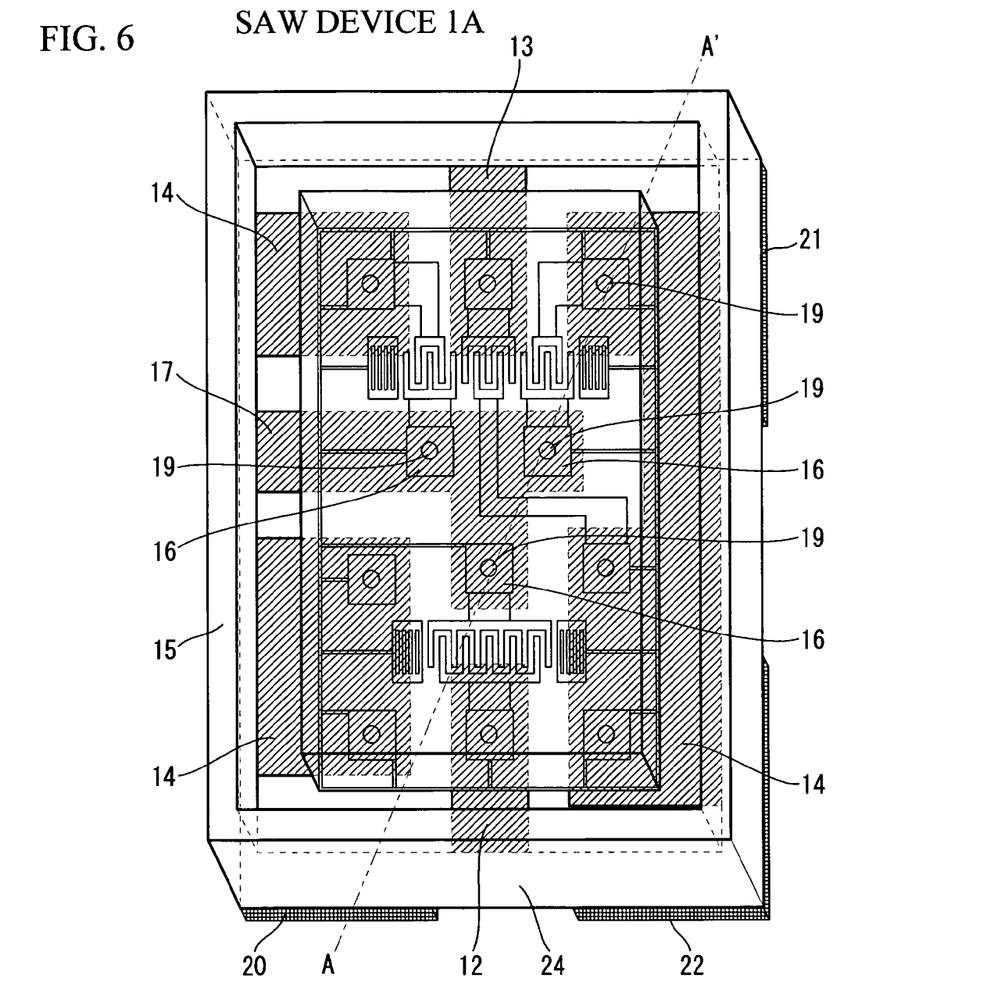
FIG. 6 is a perspective view of a SAW device 1A in accordance with the first embodiment of the present invention.

The SAW chip 1b is flip-chip mounted on the above-mentioned package 1c in the facedown state. The SAW device 1A is thus produced. FIG. 6 shows a configuration of the SAW device 1A.

Referring to FIG. 6, the input signal pad 1, the output signal pad 2, the ground pads 3, the dummy pads 4, and the signal interconnection pads 16 on the SAW chip 1b are respectively connected to the input signal interconnection 12, the output signal interconnection 13, the ground interconnections 14, and the signal interconnection 17 with bumps 19, on the SAW device 1A.

Aluminum (Al), copper (Cu), or gold (Au) may be used for the bumps 19.

Figure 7:
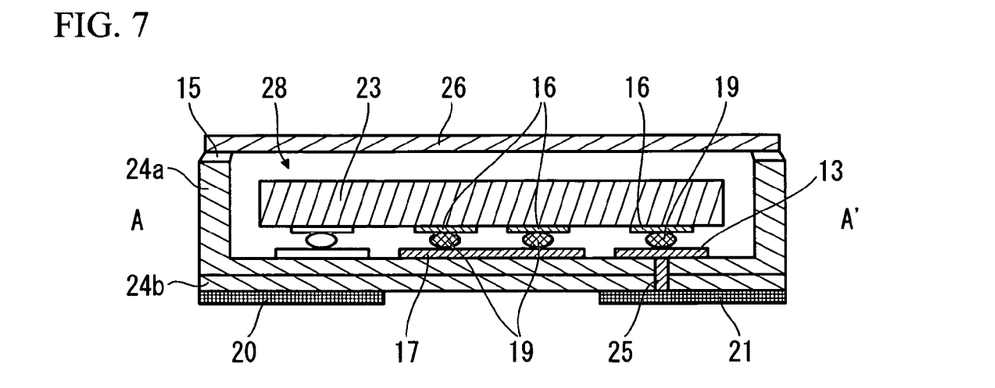
FIG. 7 is a cross sectional view taken along a line A–A' shown in FIG. 6.

As described above, the SAW chip 1b is electrically coupled to the chip mounting surface of the package 1c, and is mechanically secured. FIG. 7 is a schematic cross sectional view taken along a line A–A' shown in FIG. 6. As shown in FIG. 7, the cavity 28 is sealed with the lid 26.

As shown in FIG. 7, the signal interconnection pads 16 on the SAW chip 1b are electrically coupled to the signal interconnection 17 on the chip mounting surface of the package 1c, with bumps 19. The signal interconnection pads 16 on the SAW chip 1b are electrically coupled to each other via the signal interconnection 17. A part of the interconnection pattern that connects the resonators on the SAW chip 1b is extracted onto the package. The resonators are the resonator 11 and the three-IDT multimode filter 10.

The output signal interconnection 13 is electrically coupled to the output terminal (the backside output terminal 21) on the backside of the package 1c through a via interconnection 25 that penetrates the lower part of the package 1c. The input signal interconnection 12 is electrically coupled to the output terminal (the backside input terminal 20) on the backside of the package 1c through another via interconnection that penetrates the lower part of the package 1c. In the same manner as mentioned above, the ground interconnection 14 is electrically coupled to the output terminal (the backside ground terminal 22) on the backside of the package 1c through still another via interconnection that penetrates the lower part of the package 1c.

Generally, it is possible to freely decide the thickness of the interconnection such as 12, 13, 14, and 17 provided on the package 1c, without depending on the thickness of the IDTs of the resonators. Therefore, it is possible to set the impedance of the interconnection pattern at an arbitrary value, by arranging at least a part of the interconnection pattern connecting the resonators on the package 1c in accordance with the first embodiment of the present invention. In addition, it is possible to readily adjust the thickness of the interconnection pattern arranged on the package 1c. This results in an easy adjustment of the impedance of the interconnection that connects the resonators. Further, generally, the thickness of the interconnection pattern that is provided on the package 1c does not have an upper limit. By making the interconnection pattern thicker, it is possible to reduce the resistance of the interconnection pattern connecting the resonators. It is thus possible to reduce the insertion loss of the SAW device 1A and thereby improve the filter characteristics.

Figure 8:
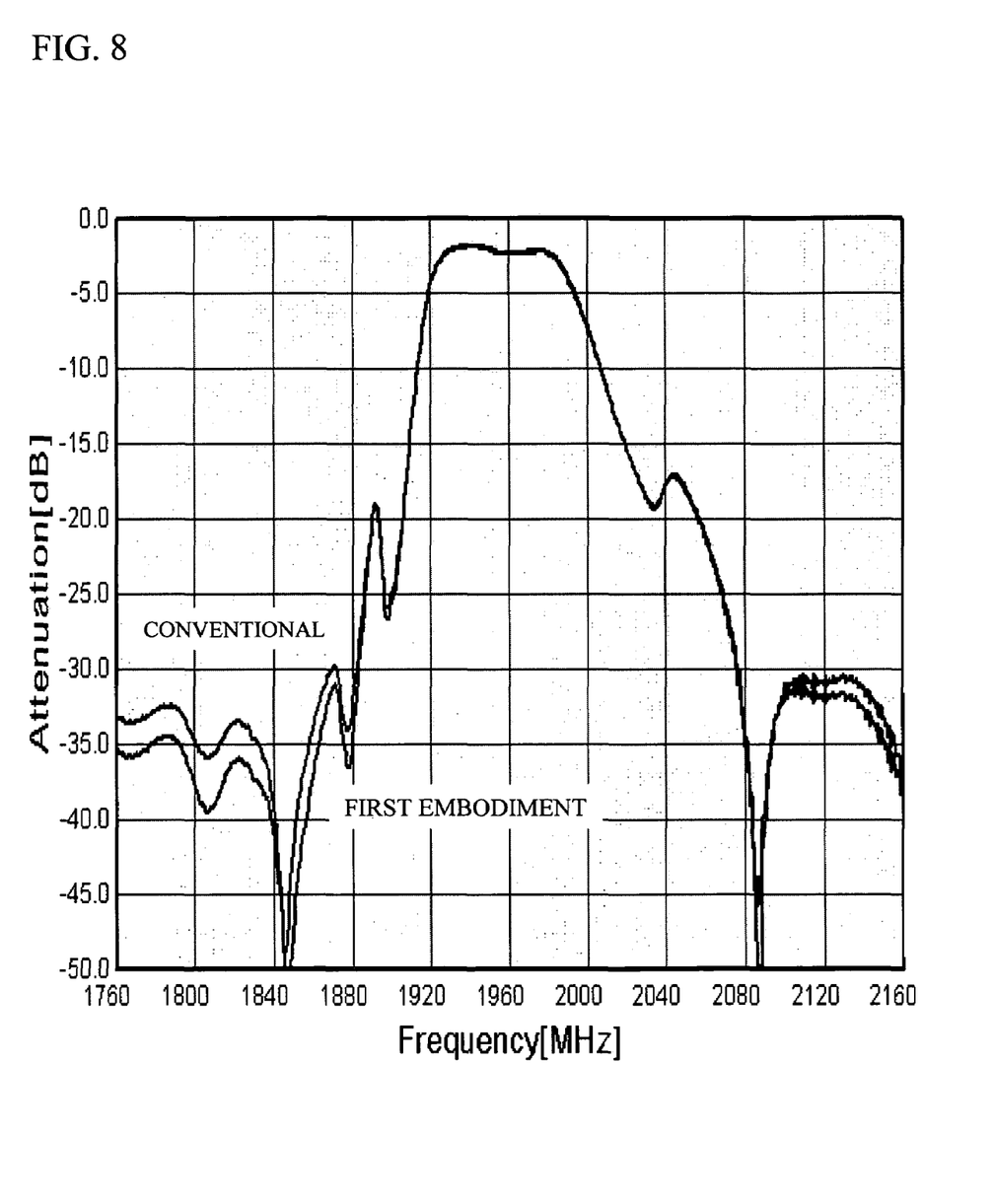
FIG. 8 shows filter characteristics of the SAW device 1A in accordance with the first embodiment of the present invention.
Figure 9:
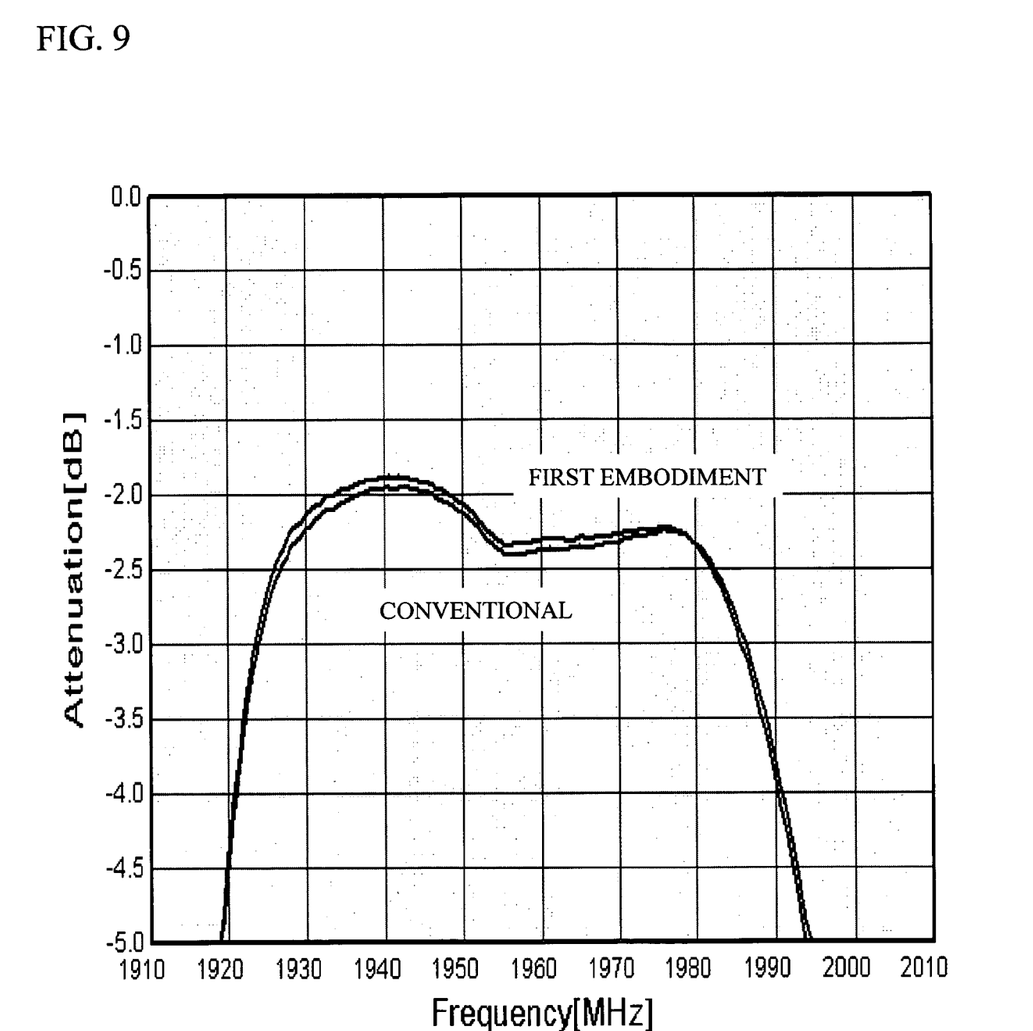
FIG. 9 is an enlarged view of passband shown in FIG. 8.

FIG. 8 shows filter characteristics of the SAW device 1A in accordance with the first embodiment of the present invention. FIG. 9 is an enlarged view of passband shown in FIG. 8. FIG. 8 shows a case where the SAW device 1A is produced as a filter for the 1.9 GHz band (center frequency fc is 1960 MHz). More specifically, aluminum base alloy is used for an electrode material of the resonator 11 and the three-IDT multimode filter 10. The thickness of the electrodes is set to 140 nm (nanometers). Accordingly, the interconnection pattern 5 is produced with a film of aluminum base alloy having a thickness of 140 nm. Nickel (Ni) or gold (Au) plating is performed on the metal film that is formed by metalizing tungsten, with regard to the various interconnections 12, 13, 14, and 17. The thickness in this case is set to 7.0 μm.

Figure 10:
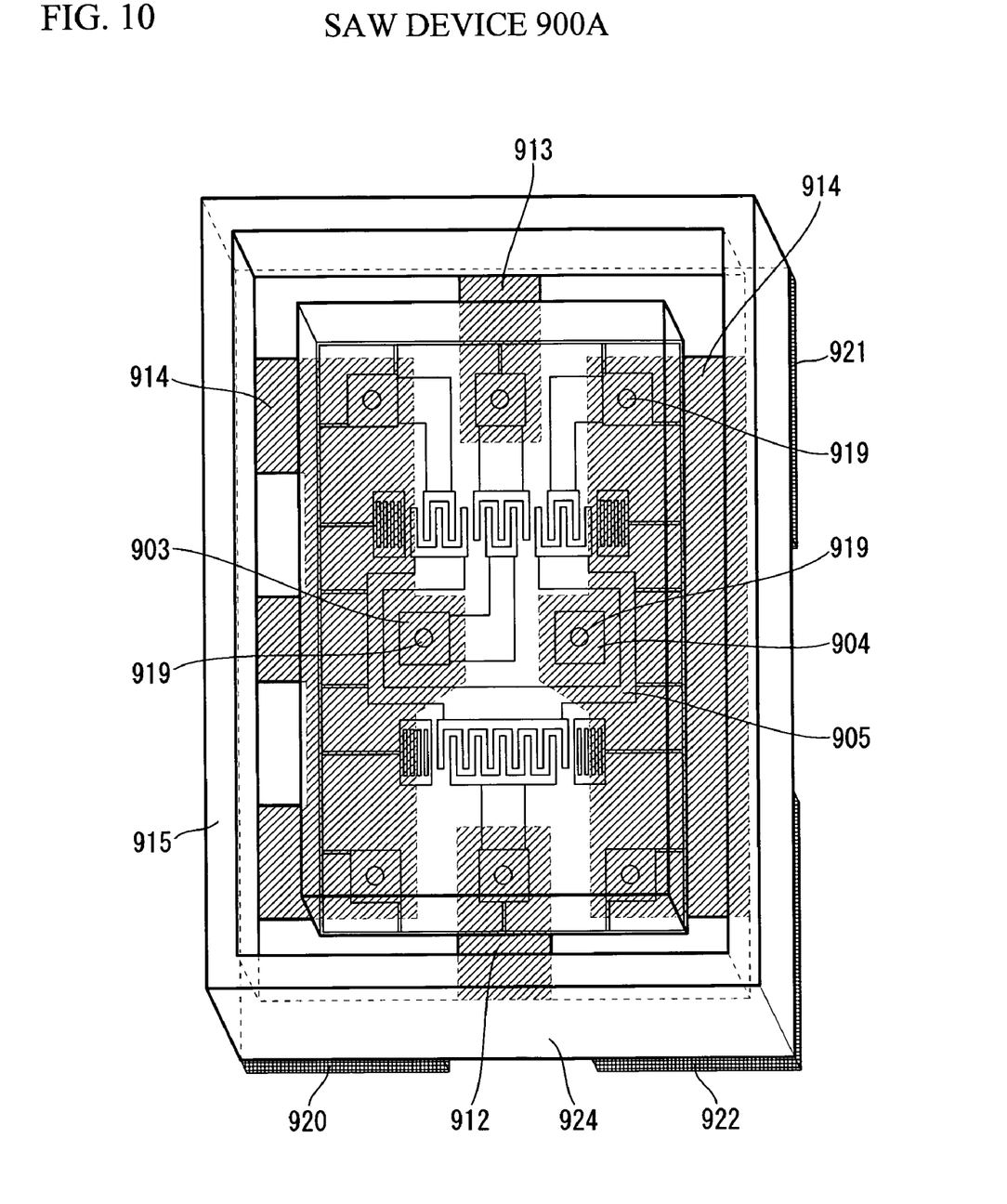
FIG. 10 is a perspective view of a conventional SAW device 900A.

The filter characteristics of the conventional SAW device are shown in FIGS. 8 and 9, for comparison. The conventional SAW device is the SAW device 900A that includes the package 900c on which the SAW chip 900b is mounted. FIG. 10 shows a conventional SAW device 900A. The SAW device 900A is the SAW filter for the 1.9 GHz band (center frequency fc is 1960 MHz). More specifically, aluminum base alloy (Al) is used for an electrode material of the resonator 911 and the three-IDT multimode filter 910. The thickness of the electrodes is set to 140 nm (nanometers). Accordingly, the interconnection pattern 5 is produced with a film of aluminum base alloy having a thickness of 140 nm.

As is apparent from FIGS. 8 and 9, the passband of the SAW device 1A in accordance with the first embodiment of the present invention, in particular, the insertion loss in the center frequency fc is approximately −2.3 dB. A 0.1 dB improvement is achieved as compared to the passband of the conventional SAW device 900A (−2.4 dB), namely, the insertion loss in the center frequency fc, especially referring to FIG. 9. With regard to attenuation out of the pass band, there is substantially no difference between the SAW device 1A and the SAW device 900A, especially referring to FIG. 8.

As described above, it is possible to reduce the wiring resistance, by arranging at least a part of the interconnections that connect the resonators on the package. This results in a reduction in the insertion loss. Then, the filter characteristics are improved. In addition, in the above-mentioned configuration, it is possible to design the interconnections provided on the package flexibly and thereby easy to adjust the impedance of the interconnections that connect the resonators. Further, in accordance with the first embodiment of the present invention, it is no longer necessary to widen the width of the interconnection so as to reduce the resistance of the interconnection and adjust the impedance. Thus the SAW device as small as the conventional one is obtainable.

(Second Embodiment)

A description will be given of a second embodiment of the present invention with reference to the accompanying drawings. Hereinafter, in the second embodiment, the same components and configurations as those of the first embodiment have the same reference numerals and a detailed explanation will be omitted, if not otherwise specified.

Figure 11:
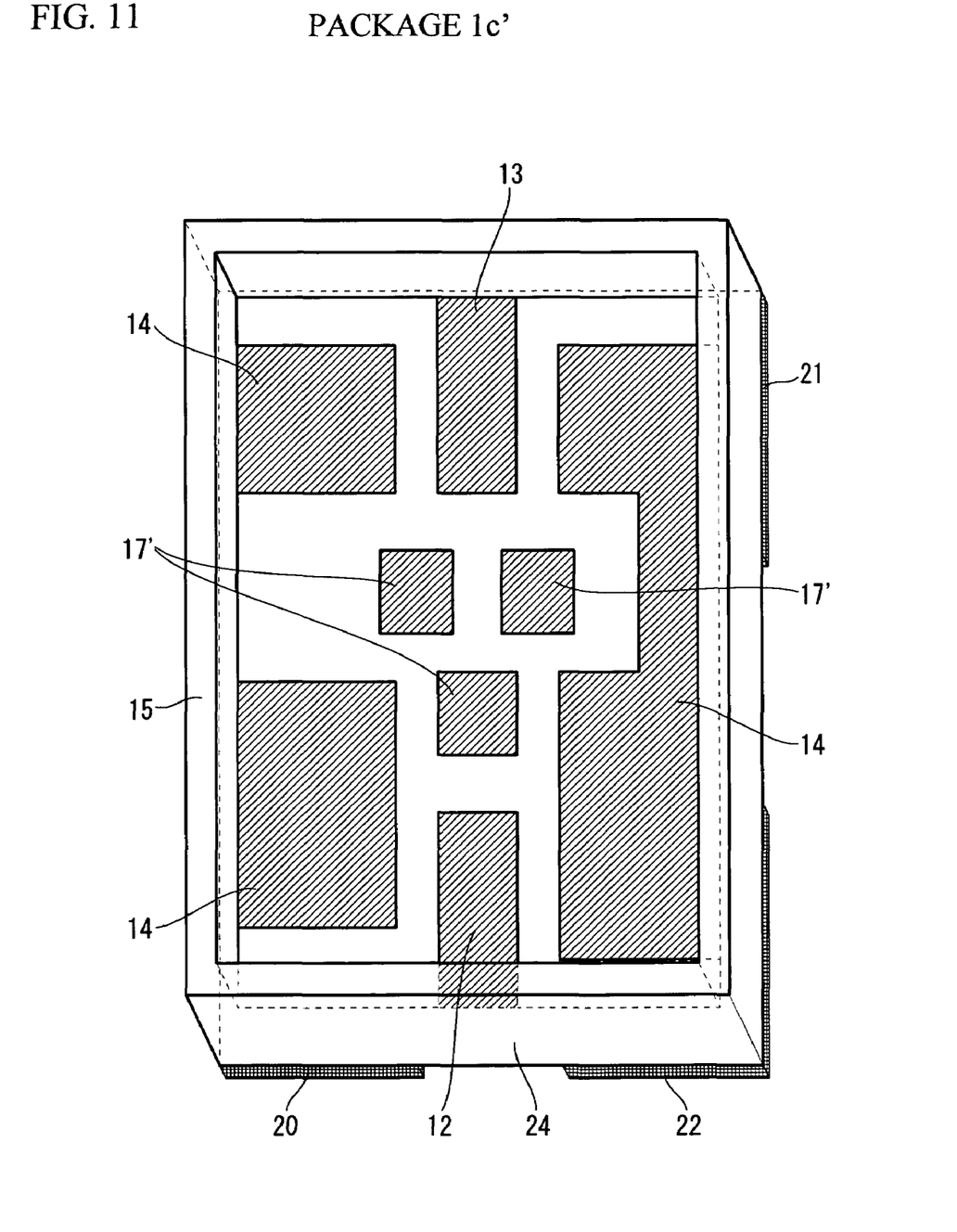
FIG. 11 is a perspective view of a package 1c' in accordance with a second embodiment of the present invention.
Figure 12:
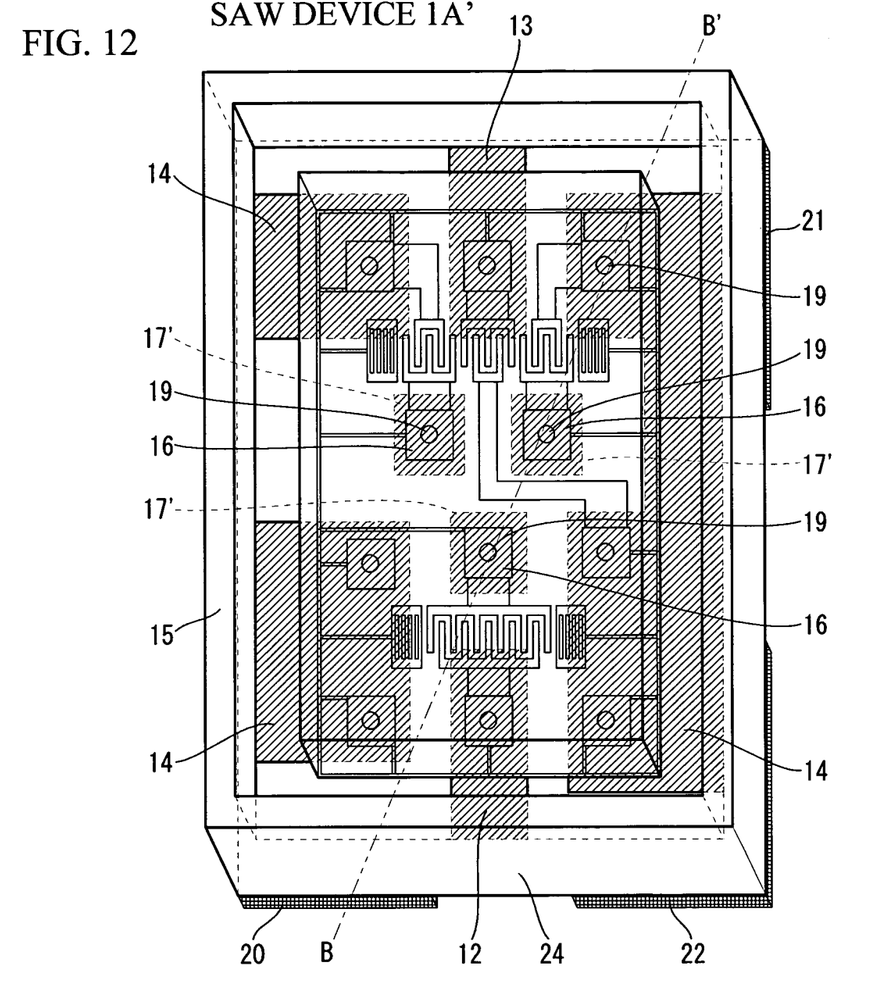
FIG. 12 is a perspective view of a SAW device 1A' in accordance with the second embodiment of the present invention.
Figure 13:
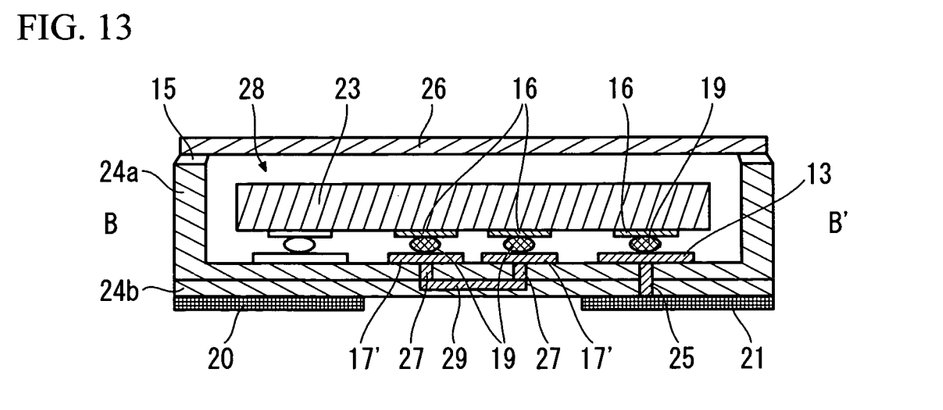
FIG. 13 is a cross sectional view taken along a line B–B' shown in FIG. 12.

In accordance with the second embodiment of the present invention, a description will be given of another configuration of the package 1c in accordance with the second embodiment of the present invention. FIG. 11 is a perspective view of the package 1c' in accordance with the second embodiment of the present invention. Referring to FIG. 11, the signal interconnection 17 on the package 1c is replaced by three signal interconnections 17' on the package 1c'. These three signal interconnections 17' are provided, corresponding to the three signal interconnection pads 16 provided on the SAW chip 1b. That is, when the SAW chip 1b is mounted on the package 1c', the three signal interconnection pads 16 are respectively connected to the three signal interconnections 17' on one-to-one basis. FIG. 12 shows a configuration of a SAW device 1A' that includes the package 1c' on which the SAW chip 1b is mounted. FIG. 13 is a schematic cross sectional view taken along a line B–B' shown in FIG. 12. Also, in FIG. 13, the cavity 28 is sealed with the lid 26.

As shown in FIGS. 12 and 13, the signal interconnection pads 16 on the SAW chip 1b are electrically and respectively coupled to the signal interconnections 17' on the chip mounting surface of the package 1c'. The signal interconnection pads 17' provided on the chip mounting surface are electrically and respectively coupled to each other through the via interconnections 27 and the interconnection pattern 29. That is, the resonator 11 and the three-IDT multimode filter 10 are electrically coupled via the interconnection (inner layer) that is extracted onto the inside of the package 1c'.

As described above, the interconnections that connect the resonators may be extracted through the bottom of the cavity to the inside of the package. Other components and configurations in accordance with the second embodiment of the present invention are those of the first embodiment and a detailed explanation is omitted here.

(Third Embodiment)

A description will be given of a third embodiment of the present invention with reference to the accompanying draw ings. Hereinafter, in the third embodiment, the same components and configurations as those of the first and second embodiments have the same reference numerals and a detailed explanation will be omitted, if not otherwise specified.

A description will be given of a SAW device 1B produced as the ladder-type filter. The SAW device 1B includes a package 1d on which a SAW chip 1a is flip chip mounted in the facedown state.

Figure 14:
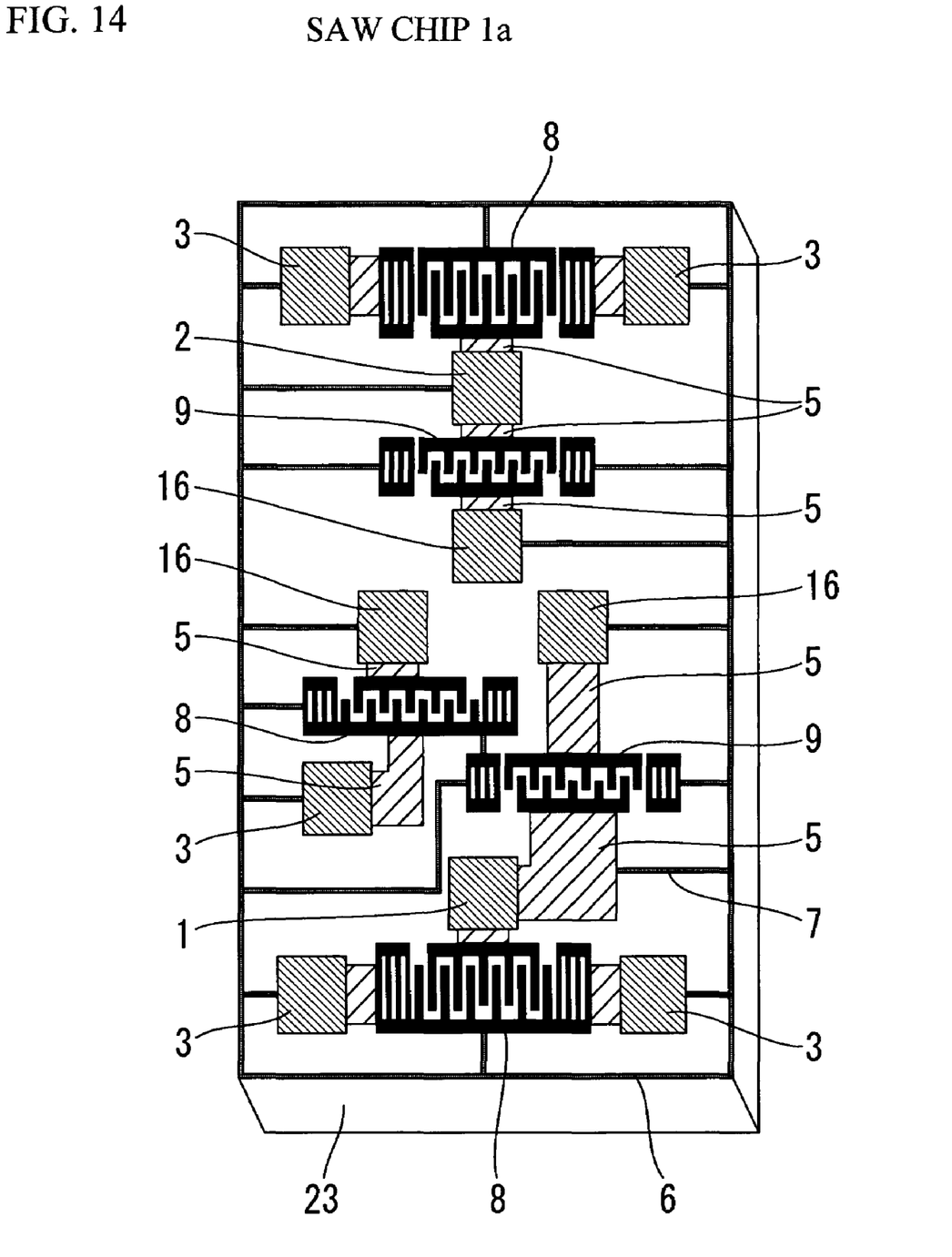
FIG. 14 is a perspective view of a SAW chip 1a in accordance with a third embodiment of the present invention.

FIG. 14 is a perspective view of the SAW chip 1a. Referring to FIG. 14, the SAW chip 1a includes an input signal pad 1, an output signal pad 2, interconnection patterns 5, parallel resonators 8, and series resonators 9. These are arranged on the main surface (which is the upper surface) of the piezoelectric substrate 23. More precisely, a parallel resonator 8 and a series resonator 9 are connected to the input signal pad 1 via an interconnection pattern 5. Another parallel resonator 8 and another series resonator 9 are connected to the output signal pad 2 via another interconnection pattern 5. Still another parallel resonator 8 is connected in parallel with the above-mentioned two series resonators 9 via still another interconnection pattern 5. The input signal pad 1 is used for feeding high-frequency signals to the SAW chip 1a. The output signal pad 2 is used for extracting the high-frequency signals that have passed the SAW chip 1a. The parallel resonator 8 and the series resonator 9 are configured to include the IDTs and the reflection electrodes.

The parallel resonators 8 are respectively connected to ground pads 3 via other interconnection patterns 5. The ground pads 3 serve as terminals that connect to the ground line on the package. That is, the parallel resonators 8 are connected the series resonators 9 and the ground.

The series resonators 9 are respectively connected to the signal interconnection pads 16 via other interconnection patterns 5. In addition, the parallel resonator 8, which is not directly connected to other resonators, is connected to the signal interconnection pads 16 via the interconnection patterns 5.

The parallel resonators 8, the series resonators 9, the input signal pad 1, the output signal pad 2, the ground pads 3, the interconnection patterns 5, and the signal interconnection pads 16 are respectively connected to a metal pattern via the short bar 7 for the purpose of avoiding the pyroelectricity. The metal pattern is arranged on an outer circumference of the upper side of the piezoelectric substrate 23, namely, the dicing line 6. The short bar 7 is also a metal pattern.

In the above-mentioned configuration, the resonators 8 and 9 are not directly connected via the interconnection patterns 5 on the SAW chip 1a, in accordance with the third embodiment of the present invention. The resonators 8 and 9 are electrically coupled to the signal interconnection pads 16 via the interconnection patterns 5. The signal interconnection pads 16 are provided separately. The signal interconnection pads 16 are electrically coupled to each other on the package 1d, as will be described later in detail.

A description will be given of the package 1d on which the SAW chip 1a is mounted.

Figure 15:
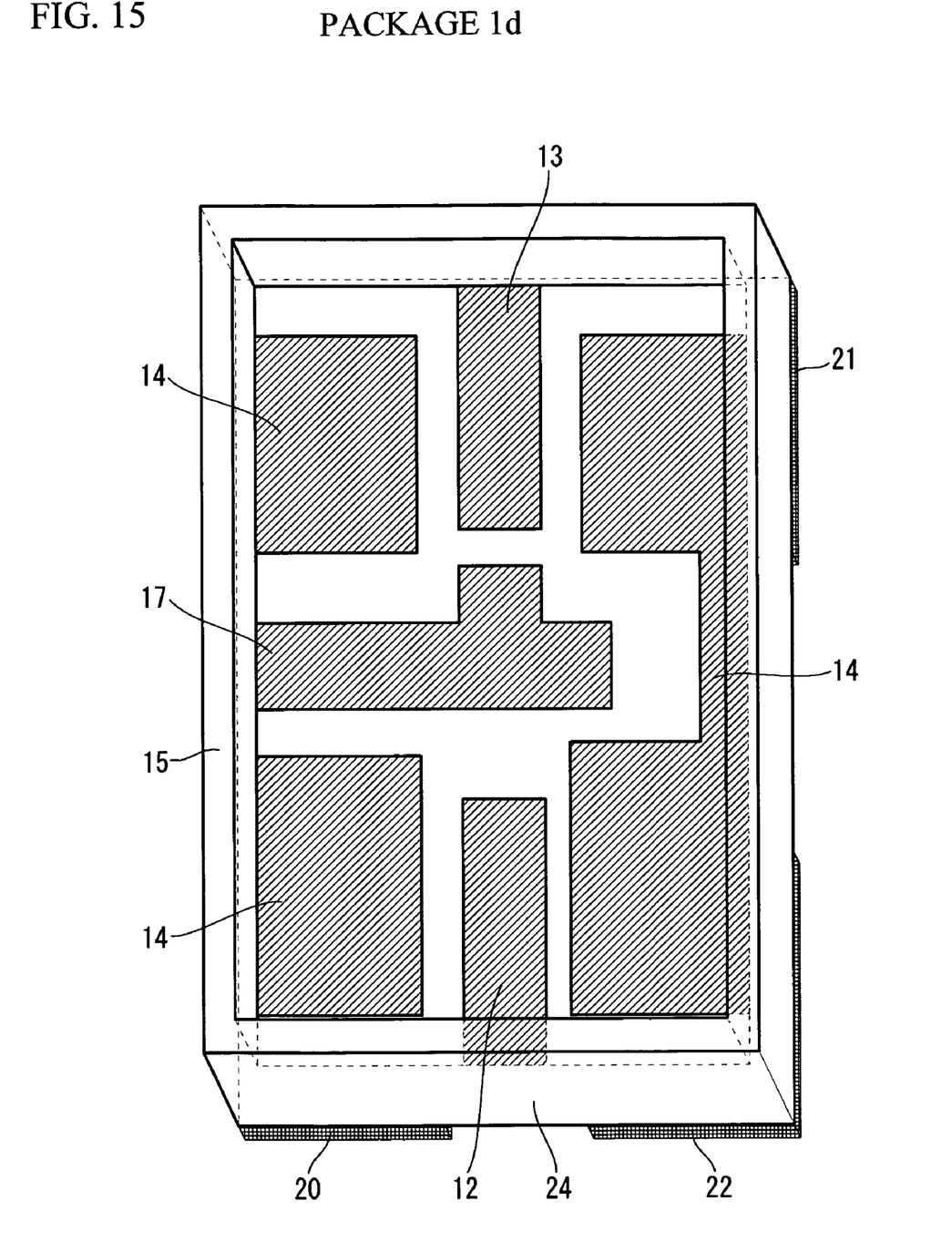
FIG. 15 is a perspective view of a package 1d in accordance with the third embodiment of the present invention.

FIG. 15 shows a perspective view of the package 1d. Referring to FIG. 15, the package 1d includes the cavity 28 provided on the substrate 24. The opening of the cavity 28 is arranged on the main surface of the substrate 24.

The input signal interconnection 12, the output signal interconnection 13, the ground interconnections 14, and the signal interconnection 17 are arranged on positions that correspond to various pads including 1, 2, 3 and 16 of the SAW chip 1a on the bottom of the cavity 28, which is the chip mounting surface.

The backside input terminal 20, the backside output terminal 21, and the backside ground terminal 22 are arranged on the backside of the package 1d. The backside input terminal 20, the backside output terminal 21, and the backside ground terminal 22 serve as external terminals. These terminals are electrically coupled to the various interconnections on the chip mounting surface as in the first embodiment of the present invention.

Figure 16:
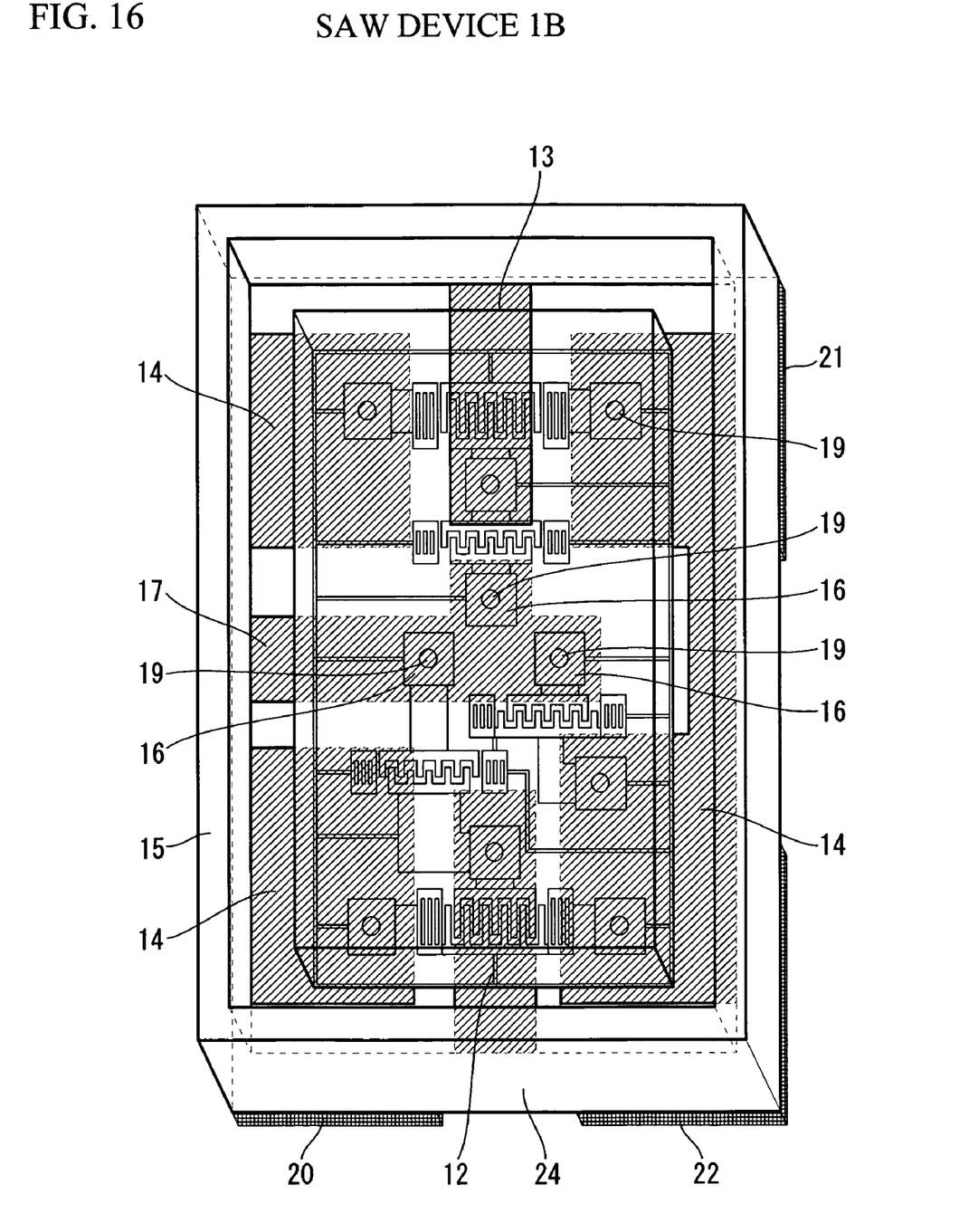
FIG. 16 is a perspective view of a SAW device 1B in accordance with the third embodiment of the present invention.

The SAW chip 1a is flip chip mounted on the above-mentioned package 1d in the facedown state to produce the SAW device 1B in accordance with the third embodiment of the present invention. FIG. 16 shows a configuration of the SAW device 1B.

Referring to FIG. 16, the input signal pad 1, the output signal pad 2, the ground pads 3, and the signal interconnection pads 16 on the SAW chip 1a are respectively connected to the input signal interconnection 12, the output signal interconnection 13, the ground interconnections 14, and the signal interconnection 17 with bumps 19, on the SAW device 1B. Thus, the SAW chip 1a is electrically coupled to the chip mounting surface of the package 1d, and is mechanically secured.

As described above, it is possible to reduce the wiring resistance as in the first embodiment of the present invention, by arranging at least a part of the interconnections that connect the resonators on the package. This results in a reduction in the insertion loss. Then, the filter characteristics are improved. In addition, in the above-mentioned configuration, it is possible to design the interconnections provided on the package freely, and thereby easy to adjust the impedance of the interconnections that connect the resonators. Further, in accordance with the third embodiment of the present invention, it is no longer necessary to widen the width of the interconnection so as to reduce the resistance of the interconnection and adjust the impedance. Thus the SAW device as small as the conventional one is obtainable.

The present invention is not limited to the above-mentioned embodiments, and other embodiments, variations and modifications may be made without departing from the scope of the present invention.

The present invention is based on Japanese Patent Application No. 2004-005954 filed on Jan. 13, 2004, the entire disclosure of which is hereby incorporated by reference.

What is claimed is:

1. A surface acoustic wave (SAW) device comprising:
   a SAW chip including comb-like electrodes arranged on a piezoelectric substrate; and
   a package on which the SAW chip is flip-chip mounted, the package including an interconnection that connects the comb-like electrodes, the interconnection being thicker than the comb-like electrodes,
   wherein the package comprises a laminated body, and the interconnection of the package is provided in the laminated body.

2. A surface acoustic wave (SAW) device comprising:
   a SAW chip including comb-like electrodes arranged on a piezoelectric substrate; and
   a package on which the SAW chip is flip-chip mounted, the package including an interconnection that connects the comb-like electrodes, the interconnection being thicker than the comb-like electrodes, and
   further comprising interconnections that connect the comb-like electrodes, wherein a part of multiple interconnections is provided in the package.

* * * * *